(12) United States Patent
Onishi et al.

(10) Patent No.: US 7,779,554 B2
(45) Date of Patent: Aug. 24, 2010

(54) HOLDING GRIPPER AND HOLDING METHOD FOR SEMICONDUCTOR WAFER AND SHAPE MEASURING APPARATUS

(75) Inventors: Masato Onishi, Fukushima (JP); Koichi Kanaya, Fukushima (JP)

(73) Assignees: Shin-Etsu Handotai Co., Ltd., Tokyo (JP); Japan ADE. Ltd., Tokyo (JP)

( * ) Notice: Subject to any disclaimer, the term of this patent is extended or adjusted under 35 U.S.C. 154(b) by 393 days.

(21) Appl. No.: 11/885,189

(22) PCT Filed: Mar. 9, 2006

(86) PCT No.: PCT/JP2006/304568

§ 371 (c)(1),
(2), (4) Date: Aug. 28, 2007

(87) PCT Pub. No.: WO2006/098211

PCT Pub. Date: Sep. 21, 2006

(65) Prior Publication Data

US 2009/0039581 A1 Feb. 12, 2009

(30) Foreign Application Priority Data

Mar. 16, 2005 (JP) ............................. 2005-074503

(51) Int. Cl.
*G01B 5/00* (2006.01)
(52) U.S. Cl. .............................. 33/573; 33/645; 294/65
(58) Field of Classification Search .................... 33/573, 33/520, 533, 613, 644, 645, 562; 414/935, 414/941; 294/65
See application file for complete search history.

(56) References Cited

U.S. PATENT DOCUMENTS

| | | | | |
|---|---|---|---|---|
| 4,566,841 A | * | 1/1986 | Ohmura et al. | ........ 414/416.08 |
| 4,603,897 A | * | 8/1986 | Foulke et al. | .............. 294/64.1 |
| 4,717,190 A | * | 1/1988 | Witherspoon | .............. 294/99.2 |
| 4,960,298 A | * | 10/1990 | Moroi | ........................ 294/64.1 |
| 5,765,890 A | * | 6/1998 | Gaylord et al. | ............... 294/65 |
| 5,810,935 A | * | 9/1998 | Lee et al. | ..................... 118/728 |
| 6,055,694 A | * | 5/2000 | Steere | ........................... 15/77 |
| 6,820,349 B2 | * | 11/2004 | Peine | ........................ 33/645 |
| 7,022,211 B2 | * | 4/2006 | Yoshioka et al. | ....... 204/297.01 |
| 7,029,224 B2 | * | 4/2006 | Kubo et al. | ................. 414/680 |

FOREIGN PATENT DOCUMENTS

| | | |
|---|---|---|
| JP | A 2002-539621 | 11/2002 |
| WO | WO 00/54941 | 9/2000 |
| WO | WO 03/027652 A1 | 4/2003 |

\* cited by examiner

*Primary Examiner*—G. Bradley Bennett
*Assistant Examiner*—Tania C Courson
(74) *Attorney, Agent, or Firm*—Oliff & Berridge, PLC

(57) ABSTRACT

The present invention provides a strip-like holding gripper which holds a semiconductor wafer when measuring a shape of the semiconductor wafer, wherein a side where the semiconductor wafer is held has a round shape, a groove which holds an edge of the semiconductor wafer along a side surface of the round shape portion is provided on the side surface, and the groove comes into contact with the edge of the semiconductor wafer from a periphery of the wafer to hold the semiconductor wafer. As a result, it is possible to provide the gripper, which can stably hold the wafer in a fixed state even if the gripper is inclined when holding the wafer, a holding method, and a shape measuring apparatus.

12 Claims, 12 Drawing Sheets

HOLDING GRIPPER AND HOLDING METHOD FOR SEMICONDUCTOR WAFER AND SHAPE MEASURING APPARATUS

TECHNICAL FIELD

The present invention relates to shape measurement of a semiconductor wafer, and more particularly to a gripper which holds a silicon wafer, a shape measuring apparatus using this gripper, and a method for holding a semiconductor wafer.

BACKGROUND ART

As a general wafer shape measuring apparatus, these is one having a fundamental principle of holding three edges (provided at intervals of 120°) of a silicon wafer having a diameter of 300 mm by a holding assembly called a strip-like gripper having a thickness of approximately 1 mm and scanning an entire plane of the wafer by an electrostatic capacitance sensor while rotating the wafer, thereby measuring a thickness and a shape of the wafer, for example. A contact part of the gripper which holds the wafer with respect to the wafer has a shape obtained by forming a groove with a curvature radius of 0.7 mm in one linear side of the strip-like shape, and the wafer is fitted and pressed in this groove to prevent the wafer from coming off due to high-speed rotation during measurement (see Japanese Patent Application Laid-open No. 2002-539621).

In the shape measuring apparatus, although the gripper applies a fixed stress to press the wafer in order to present the wafer from coming off due to rotation, the shape of the wafer may be deformed due to the stress at this moment. The grippers are arranged on an outer periphery of the wafer at intervals of 120 degrees so that the stress is uniformly applied to the wafer in order to suppress the deformation to the minimum level.

At this moment, if a central line of the grippers is placed on an extension of a radius of the wafer, the wafer can be gripped at ideal positions, and the deformation of the wafer can be suppressed to the minimum level, thereby excellently maintaining reproducibility of a shape measurement value and correlativity between apparatuses.

However, since an adjustment width is provided to a member called a flexure, which fixes the gripper, the gripper is actually set with a slight inclination, but quantitatively measuring the inclination of the gripper is difficult. When the gripper is inclined, the gripper cannot hold the wafer at the center of the gripper, and holding positions (contact parts between the grippers and the semiconductor wafer) are not provided at intervals of 120 degrees.

Therefore, concentration of the stress occurs in a given direction, and the gripper holds the wafer with an actual shape of the wafer being deformed when the original shape of the wafer interferes with concentration of the stress, thereby deteriorating the reproducibility of a measurement value and the correlativity between apparatuses. Therefore, when the reproducibility of a shape measurement value and the correlativity between apparatuses are not stabilized, there occurs a problem that measurement values become different from each other.

Since controlling an inclination of the flexure as a base portion of the gripper is difficult, maintaining and managing a state where the gripper is not inclined is very difficult.

DISCLOSURE OF THE INVENTION

In view of the above-explained problem, it is an object of the present invention to provide a gripper, which can stably hold a wafer even if the gripper is inclined when holding the wafer, a holding method, and a shape measuring apparatus.

According to the present invention, there is provided a strip-like holding gripper which holds a semiconductor wafer when measuring a shape of the semiconductor wafer, wherein a side where the semiconductor wafer is held has a round shape, a groove which holds an edge of the semiconductor wafer along a side surface of the round shape portion is provided on the side surface, and the groove comes into contact with the edge of the semiconductor wafer from a periphery of the wafer to hold the semiconductor wafer.

According to such a strip-like holding gripper which holds a semiconductor wafer when measuring a shape of the semiconductor wafer, when its side where the semiconductor wafer is held has a round shape, the round shape enables stably holding the semiconductor wafer even if the gripper is inclined, occurrence of concentration of a stress in a given direction can be lessened, and the semiconductor wafer can be prevented from being deformed. As a result, accurate measurement can be performed, and the reproducibility of a measurement value and the correlativity between apparatuses can be improved. As such a round shape, a shape having a length falling within the range of a length of the holding gripper to a radius of the supported wafer as a radius thereof can be used.

At this time, it is desirable that the round shape has a length of the holding gripper as a radius.

When the round shape has the length of the gripper as a radius thereof in particular, the semiconductor wafer can be always stably held in a contact state having the same effect as that before inclination.

Furthermore, it is desirable that a cross-sectional shape of the groove has a curvature radius larger than a curvature radius of a shape in the edge of the semiconductor wafer.

When the cross-sectional shape of the groove in the holding gripper has the curvature radius larger than the curvature radius of the shape in the edge of the semiconductor wafer in this manner, a part where the edge of the semiconductor wafer comes into contact with the holding gripper can be restricted to one position, thereby minimizing a stress which may possibly deform the shape of the semiconductor.

Moreover, it is desirable that a material of at least a part of the holding gripper, which forms the groove that comes into contact with the edge of the wafer, is a synthetic resin.

When the material of the part in the holding gripper, which forms the groove coming into contact with the edge of the wafer, is a synthetic resin in this manner, the wafer is not damaged or contaminated, and a stress that is applied to the semiconductor wafer can be reduced.

Additionally, desirably, there is provided a semiconductor wafer shape measuring apparatus, which holds a semiconductor wafer to measure a shape, comprising at least the holding gripper.

When the semiconductor wafer shape measuring apparatus which holds the semiconductor wafer to measure its shape comprises at least the holding gripper, since the holding gripper according to the present invention can stably hold the semiconductor wafer even during high-speed rotation at the time of measuring the semiconductor wafer and an interval between the respective grippers can be always fixed, concentration of a stress in a given direction can be suppressed from occurring, the wafer can be prevented from being deformed due to this concentration, and accurate measurement can be performed, thereby enhancing the reproducibility of a measurement value and the correlativity between apparatuses.

Further, according to the present invention, there is provided a semiconductor wafer holding method of holding a semiconductor wafer when measuring a shape of the semiconductor wafer, wherein grooves of the respective holding grippers come into contact with the semiconductor wafer at intervals of 120° to hold the semiconductor wafer.

When the semiconductor wafer is in contact with the grooves in the respective holding grippers at intervals of 120° at the time of measuring the shape of the semiconductor wafer, the semiconductor wafer can be stably held even if the grippers are inclined, and the contact parts between the respective grippers and the wafer are fixedly provided at intervals of 120°, thereby suppressing concentration of a stress in a given direction from occurring. Therefore, accurate measurement can be performed, thus improving the reproducibility of a measurement value and the correlativity between the apparatuses.

Like the present invention, in the strip-like holding gripper which holds a semiconductor wafer when measuring a shape of the semiconductor wafer, when its side where the semiconductor wafer is held has a round shape, a side surface of the round shape portion has a groove which holds an edge of the semiconductor wafer along this side surface and the groove comes into contact with the edge of the semiconductor wafer from a periphery of the wafer to hold the semiconductor wafer, the semiconductor wafer can be stably held even if the gripper is inclined when holding the wafer, and occurrence of concentration of a stress in a given direction can be lessened, thereby suppressing the semiconductor wafer from being deformed. As a result, a wafer shape can be accurately measured, thus improving the reproducibility of a measurement value and the correlativity of between apparatuses.

BEST MODE FOR CARRYING OUT THE INVENTION

Although an embodiment according to the present invention will now be explained hereinafter, the present invention is not restricted thereto.

According to a conventional holding gripper, a gripper presses a wafer with a fixed stress in order to prevent the wafer from coming off due to rotation when measuring a shape of the wafer, but the shape of the wafer may be deformed due to the stress at this moment in some cases.

Since an adjustment width is provided to a flexure, which fixes the gripper, the gripper is actually set with a slight inclination. Quantitatively measuring the inclination of the gripper is difficult, the gripper cannot hold the wafer at the center of the gripper when the gripper is inclined, and holding positions are not provided at intervals of 120°. Therefore, when concentration of a stress occurs in a given direction and the original shape of the wafer interferes with concentration of the stress, the gripper holds the wafer while the wafer is deformed from the actual shape, thereby deteriorating reproducibility of a measurement value and correlativity between apparatuses.

Thus, the present inventors devised a strip-like holding gripper which holds a semiconductor wafer when measuring a shape of the semiconductor wafer, wherein a side where the semiconductor wafer is held has a round shape, a groove which holds an edge of the semiconductor wafer along a side surface of the round shape portion is provided on the side surface, the gripper is arranged around the semiconductor wafer in parallel with a mains surface, and the groove comes into contact with the edge of the semiconductor wafer from a periphery of the wafer to hold the semiconductor wafer.

According to such a holding gripper, even if the gripper is inclined, the respective grippers can hold the wafer at equal angle intervals. Therefore, the semiconductor wafer can be held in a stable state, concentration of a stress in a given direction can be suppressed from occurring, and the semiconductor wafer can be prevented from being deformed. Therefore, the present inventors discovered that the wafer shape can be accurately measured and the reproducibility of a measurement value and the correlativity between apparatuses can be improved, thus bringing the present invention to completion.

The holding gripper according to the present invention will now be explained with reference to the accompanying drawings.

Figure 1:
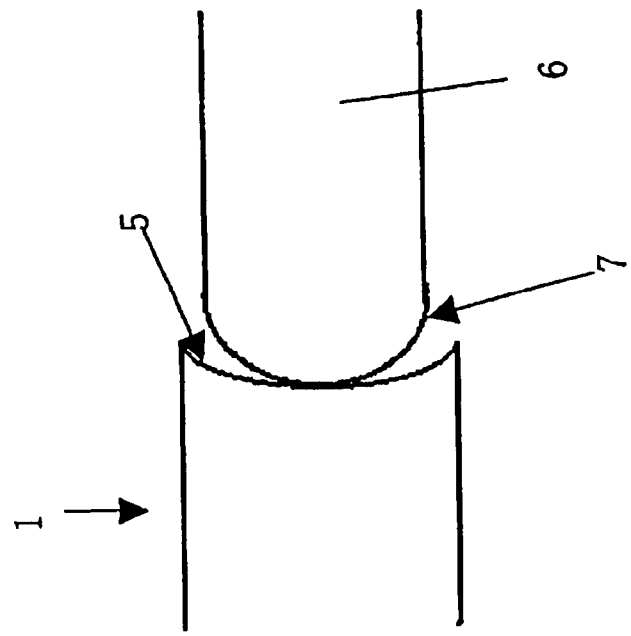
FIG. 1(A) is a schematic view of a holding gripper according to the present invention and FIG. 1(B) is a schematic view of a contact part between the holding gripper according to the present invention and a semiconductor wafer.
Figure 1:
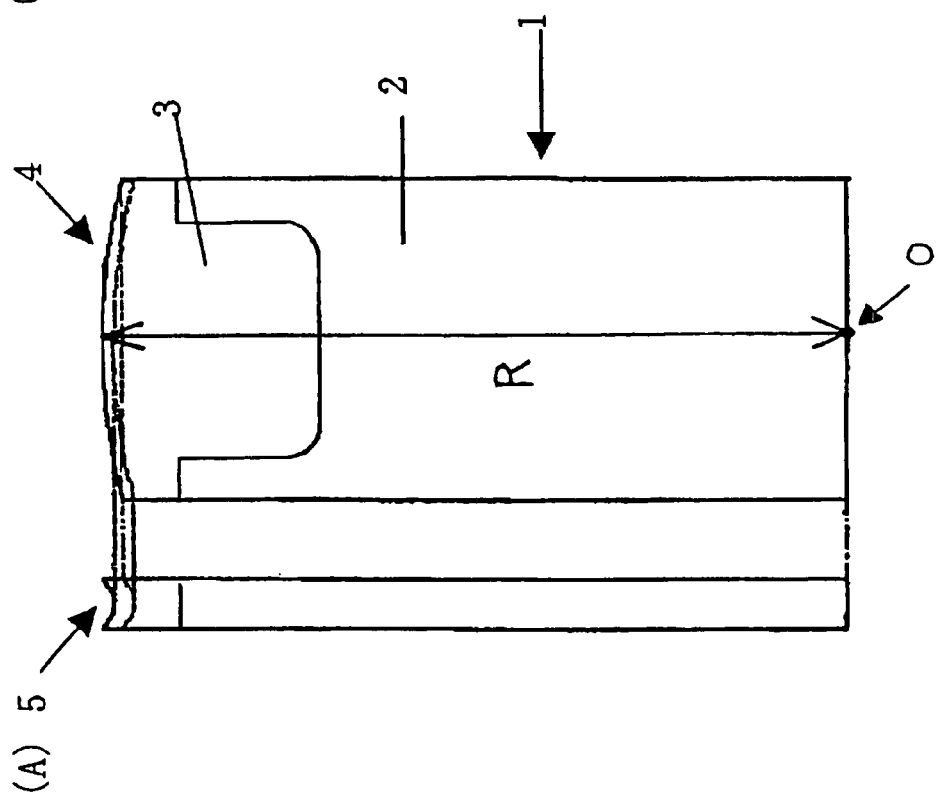

FIG. 1(A) is a schematic view showing a wafer holding gripper according to the present invention, and FIG. 1(B) is a schematic view of a contact part between the gripper according to the present invention and a semiconductor wafer.

A holding gripper 1 according to the present invention includes a gripper main body 2 and a wafer holding portion 3 on a side where a semiconductor wafer 6 is held, and an end of the wafer holding portion 3 has a round shape having a length of the gripper 1 determined as a radius (a round shape portion 4). Further, a groove 5, which holds the wafer 6 along a side surface of the round shape portion 4, is provided on the side surface.

It is to be noted that the length of the holding gripper mentioned in the present invention means a length R from a center O on a gripper fixing side to an end of a wafer holding side, and the round shape is formed so as to describe an arc having a radius R with O at the center.

Here, if a material of at least a part forming the groove 5 is a synthetic resin, a stress can be further readily absorbed when holding the semiconductor wafer 6, thereby a deformation of the semiconductor wafer 6 can be further lessened. Furthermore, if the synthetic resin is adopted, the semiconductor wafer is not damaged or not contaminated with, e.g., a heavy metal. As the resin, there is, e.g., a fluoropolymers or PEEK (polyether ether ketone).

Moreover, as shown in FIG. 1(B), when a curvature radius of the groove 5 is larger than a curvature radius of an edge 7 of the semiconductor wafer 6, the edge 7 comes into contact with the groove 5 at only one position, and occurrence of a stress that may possibly deform the shape of the semiconductor wafer 6 can be suppressed to the minimum level.

Figure 2:
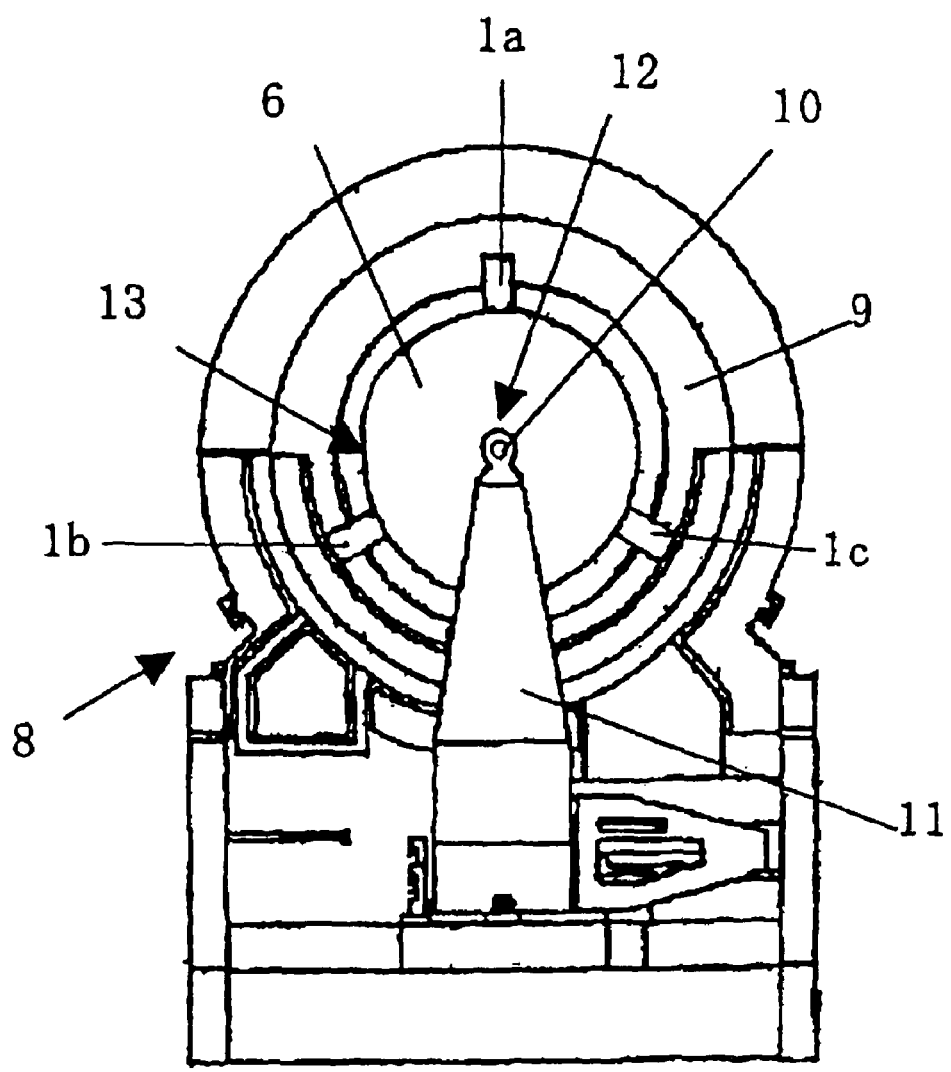
FIG. 2 is a schematic view of a shape measuring apparatus.
Figure 3:
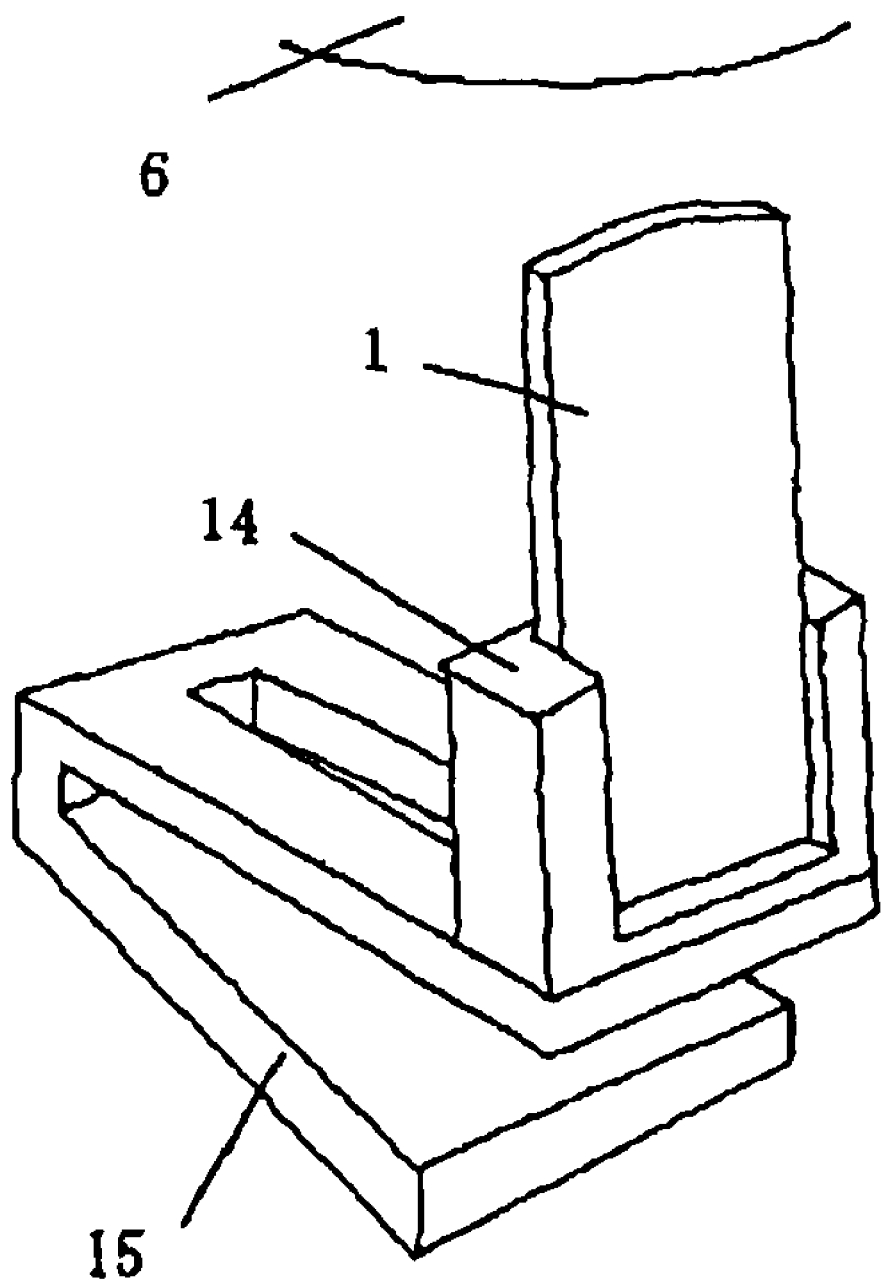
FIG. 3 is a view showing a holding mechanism of the holding gripper according to the present invention.

Next, FIG. 2 is a schematic view of a shape measuring apparatus using the holding gripper according to the present invention, and FIG. 3 shows a holding mechanism of the gripper.

This shape measuring apparatus 8 includes the grippers 1 (a gripper 1a, a gripper 1b, and a gripper 1c), a rotor 9, a sensor 10, and an arm 11 as measurement primary portions. The grippers 1 are arranged at intervals of 120° on the rotor 9 held by an air bearing, and the grippers 1 holds the semiconductor wafer 6 in a vertical direction. When the rotor 9 is rotated, the wafer held by the grippers can be rotated.

In this example, each gripper 1 is set to a flexure 14 as shown in FIG. 3, and further arranged on the rotor 9 through a leaf spring 15. The leaf spring 15 is a normal grip, and the wafer 6 can be removed from each gripper 1 by pressing the leaf spring 15 by using, e.g., an air cylinder when releasing the wafer 6 from each gripper 1.

As explained above, since the wafer is firmly held by each gripper 1, the wafer 6 held by each gripper 1 is not shaken off even if the rotor 9 is rotated at a high speed during measurement. Additionally, the sensor 10 horizontally moves from a wafer central portion 12 to a wafer end portion 13 in parallel with a surface of the wafer 6 by the arm 11 to scan a front surface of the wafer. According to the shape measuring apparatus including at least the grippers of the present invention, since the holding grippers according to the present invention can stably press the semiconductor wafer even during high-speed rotation when measuring the semiconductor wafer and intervals between the respective grippers can be always fixed, concentration of a stress in a given direction can be suppressed from occurring, the wafer can be prevented from being deformed due to this stress concentration, and a measurement accuracy can be improved, thereby enhancing the reproducibility of a measurement value and the correlativity between apparatuses.

Effectiveness of a holding method using the gripper according to the present invention will now be explained with reference to FIG. 4(A).

Now, the edge 7 of the semiconductor wafer 6 is fitted in and comes into contact with the groove 5 of the gripper 1, and the semiconductor wafer 6 is held by the gripper 1. Although the gripper 1 is fixed by the flexure 14, the flexure 14 has an adjustment width, and the gripper 1 swings from side to side. Since the groove 5 which is the contact portion is formed along the side surface portion of the round shape portion 4 as explained above, a distance R from the center O is not changed even though the gripper 1 swings from side to side, and the wafer can be held like a case where the gripper 1 does not swing. Therefore, the wafer 6 can be stably held without being pushed up to be deformed.

Further, when the grippers 1 are arranged at the periphery of the semiconductor wafer 6 at intervals of 120°, the semiconductor wafer 6 can be stably held even if each gripper 1 is inclined, each interval between the respective contact portions is 120° and fixed like arrangement intervals of the grippers 1, concentration of a stress in a given direction can be suppressed from occurring, and deformation of the semiconductor wafer 6 can be avoided.

Figure 4:
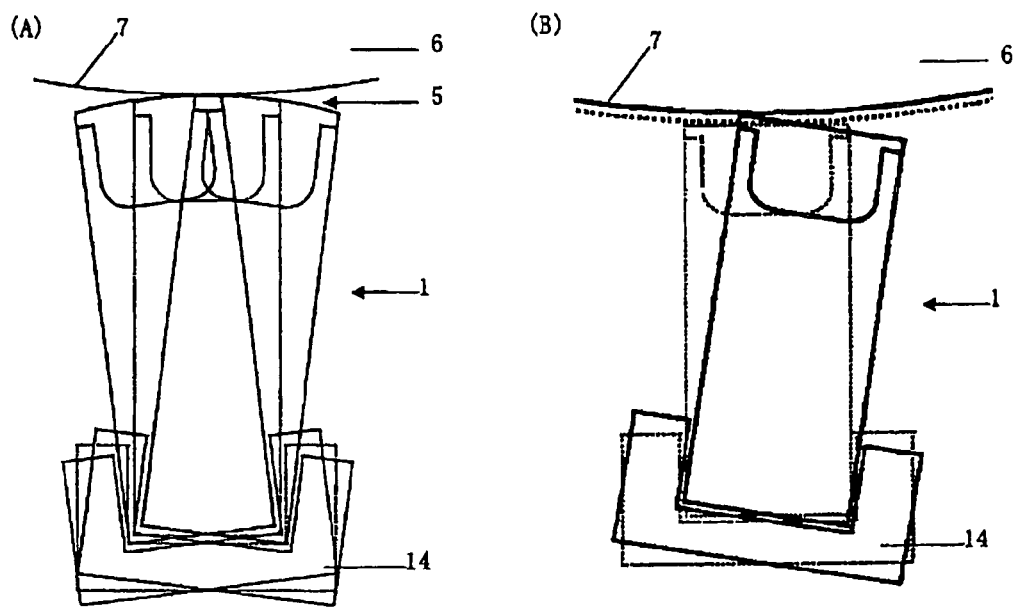
FIG. 4(A) is an explanatory drawing showing effectiveness of a holding method according to the present invention and FIG. 4(B) is an explanatory drawing showing a problem in a conventional holding method.

On the other hand, FIG. 4(B) shows a conventional gripper in which an end face on a wafer holding side has a linear flat surface for comparison. In this gripper, when the gripper is slightly swung due to, e.g., an inclination of the flexure, the wafer is held as shown in the drawing, and the wafer is, e.g., pushed up and deformed, thus making it difficult to perform accurate measurement.

Examples and comparative examples according to the present invention will now be further specifically explained, but the present invention is not restricted thereto.

9 silicon wafers each having a diameter of 300 mm were prepared as sample wafers. AFS3220 manufactured by ADE Corporation was used as a semiconductor wafer shape measuring apparatus, a conventional gripper and a gripper according to the present invention were prepared, and Bow (Bow-3p) and Warp (Warp-bf) were measured by using the respective grippers, thereby comparing the conventional gripper with the gripper according to the present invention.

It is to be noted that Bow-3p means a value indicative of a displacement to a central surface in a wafer central point with respect to a central reference plane and a direction of the displacement, the central reference plane being determined based on three points on the central surface in a thickness direction.

Furthermore, Warp-bf means a value indicative of a difference between a maximum displacement and a minimum displacement of a wafer central surface with respect to a central reference plane, the central reference plane of the central surface in a thickness direction being determined by a least-square method.

EXAMPLES 1 AND 2/COMPARATIVE EXAMPLES 1 AND 2

The grippers according to the present invention are used to hold the sample silicon wafer, thereby measuring a Bow-3p value. Then, front and back surfaces of the wafer are reversed, and the wafer is likewise held by the grippers according to the present invention to measure a Bow-3p value. This measurement was carried out with respect to each of the nine sample wafers (Example 1).

Moreover, the conventional grippers were used to perform the same measurement as that in Example 1 (Comparative Example 1).

Additionally, the same measurement was carried out with respect to a Warp-bf value (Example 2, Comparative Example 2).

Figure 5:
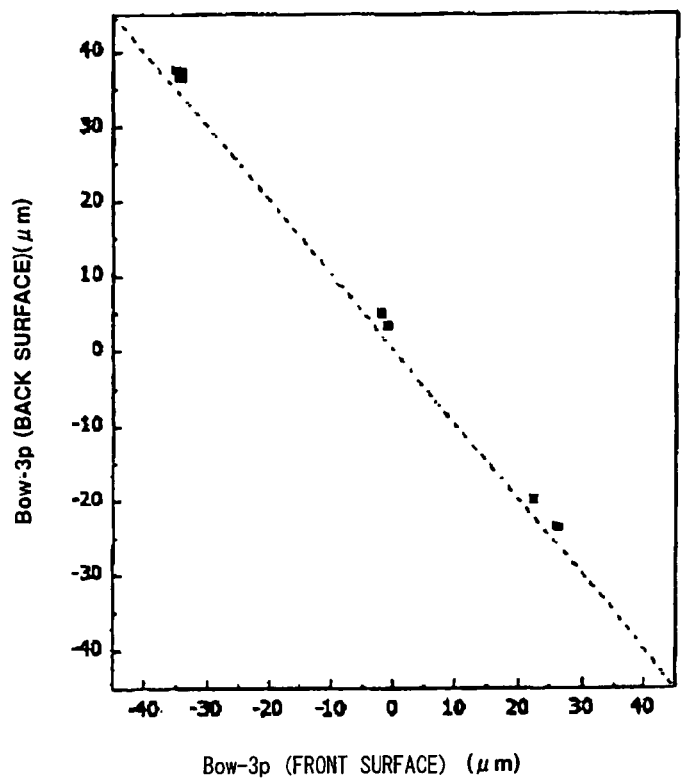
FIG. 5 shows a Bow-3p measurement result when front and back surfaces are reversed in Comparative Example 1.
Figure 6:
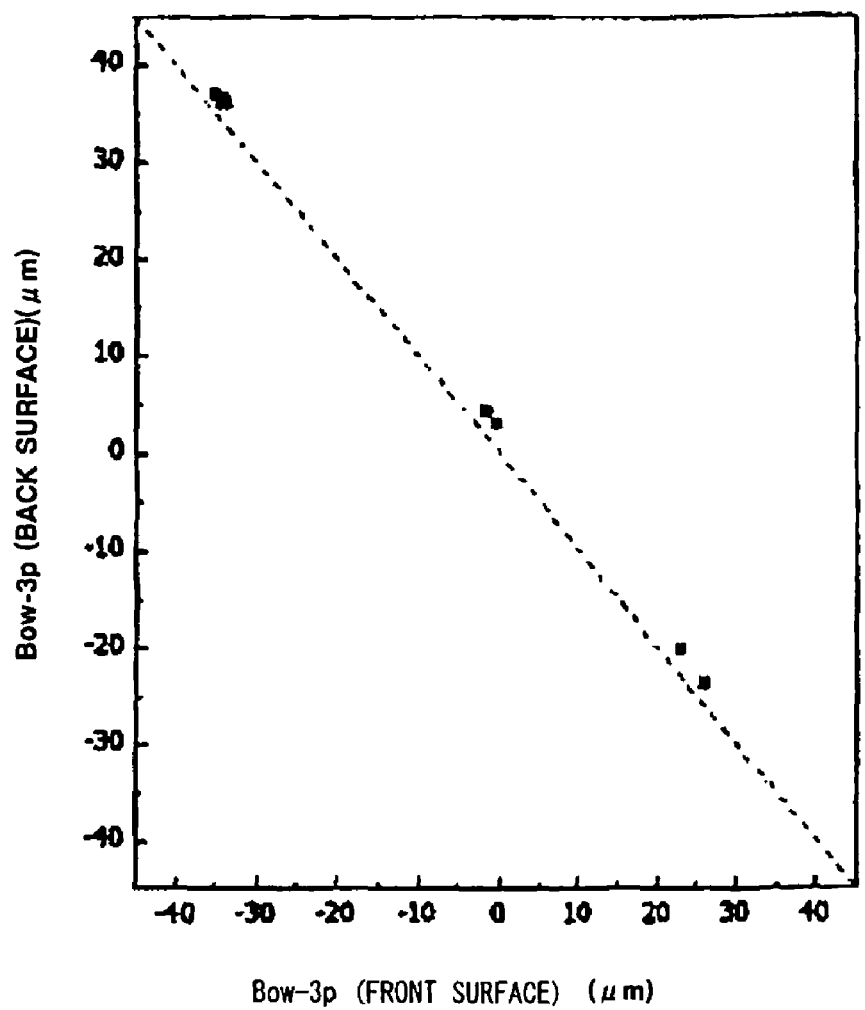
FIG. 6 shows a Bow-3p measurement result when front and back surfaces are reversed in Example 1.
Figure 7:
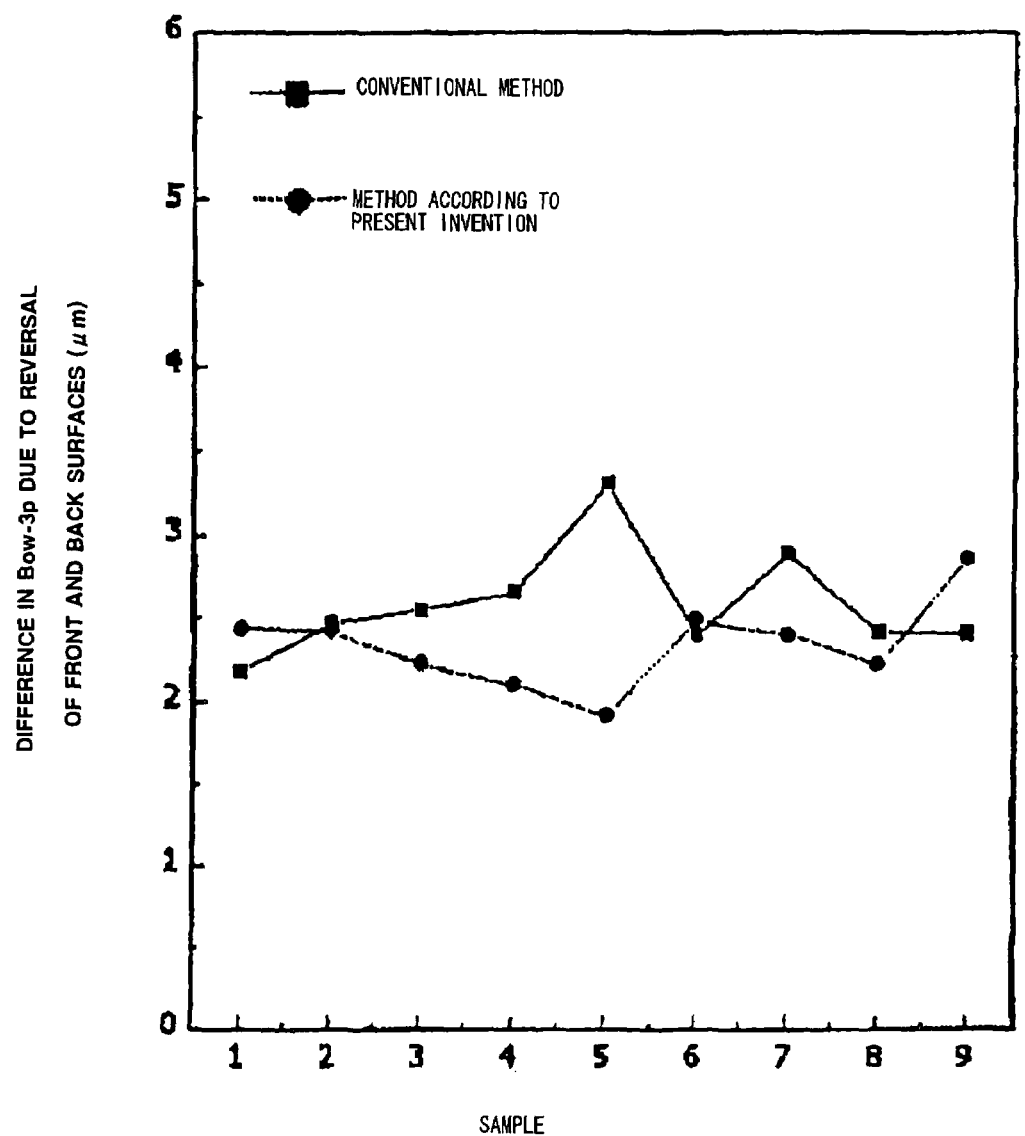
FIG. 7 is a comparative view of Example 1 and Comparative Example 1.
Figure 8:
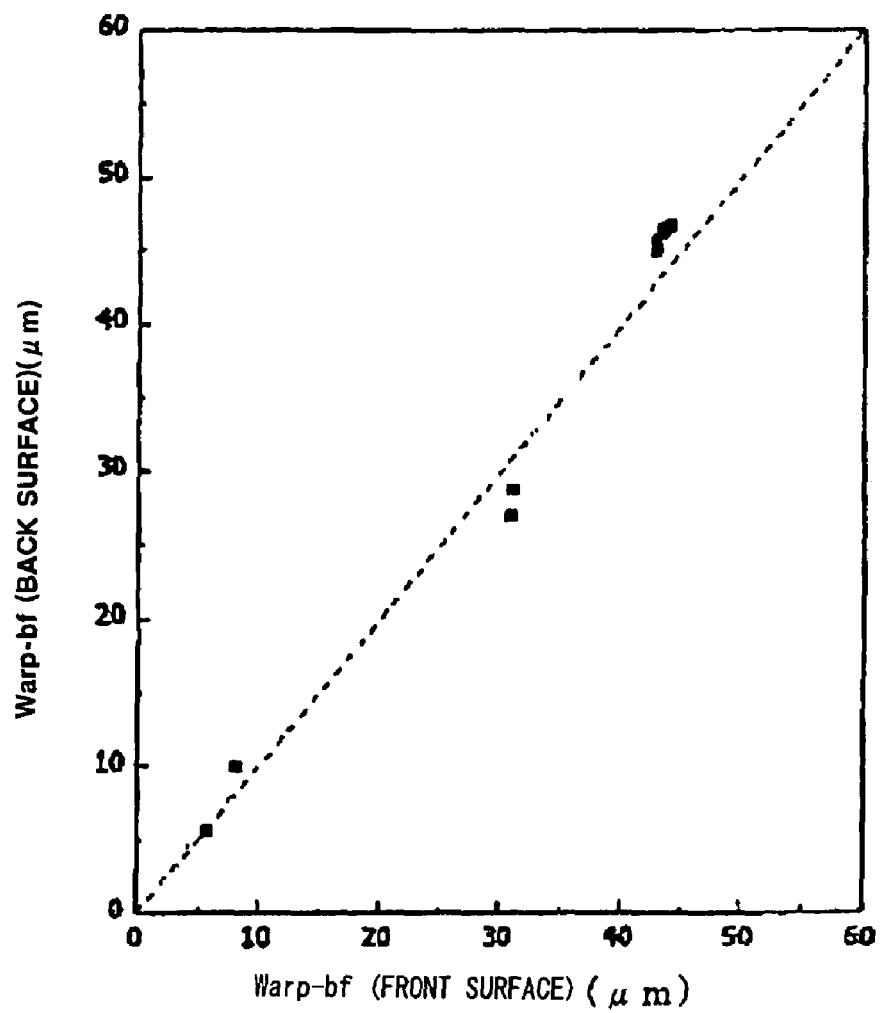
FIG. 8 is a Warp-bf measurement result when front and back surfaces are reversed in Comparative Example 2.
Figure 9:
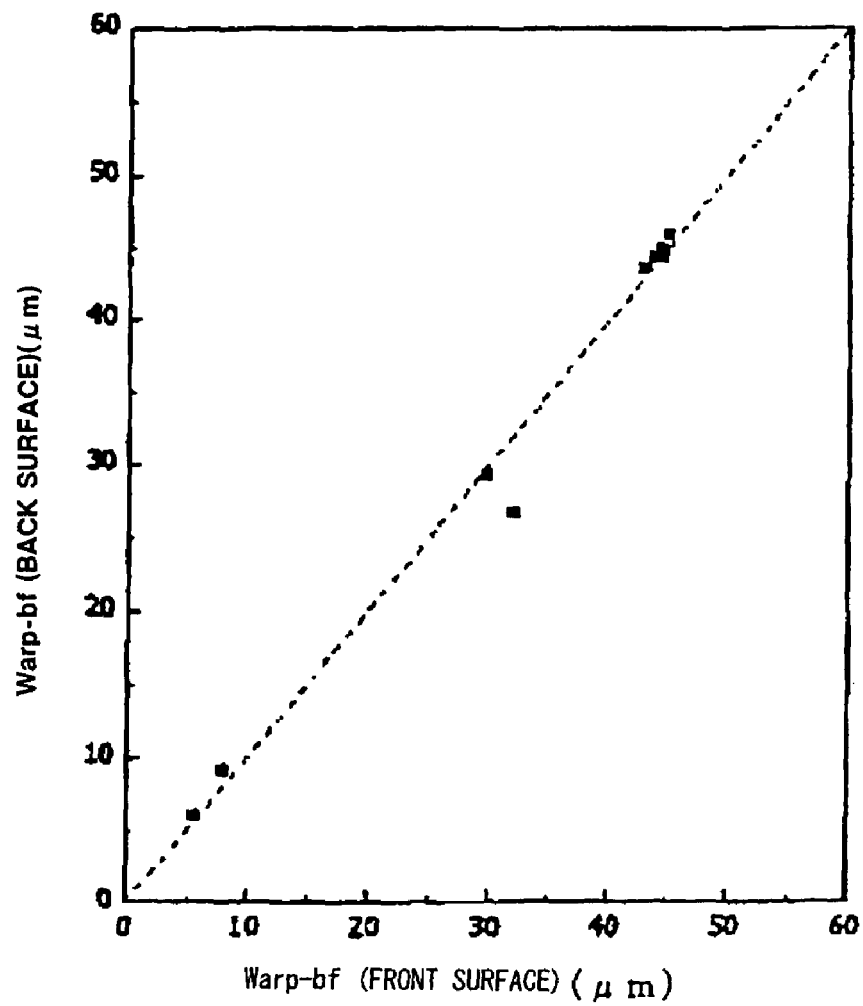
FIG. 9 is a Warp-bf measurement result when front and back surfaces are reversed in Example 2.
Figure 10:
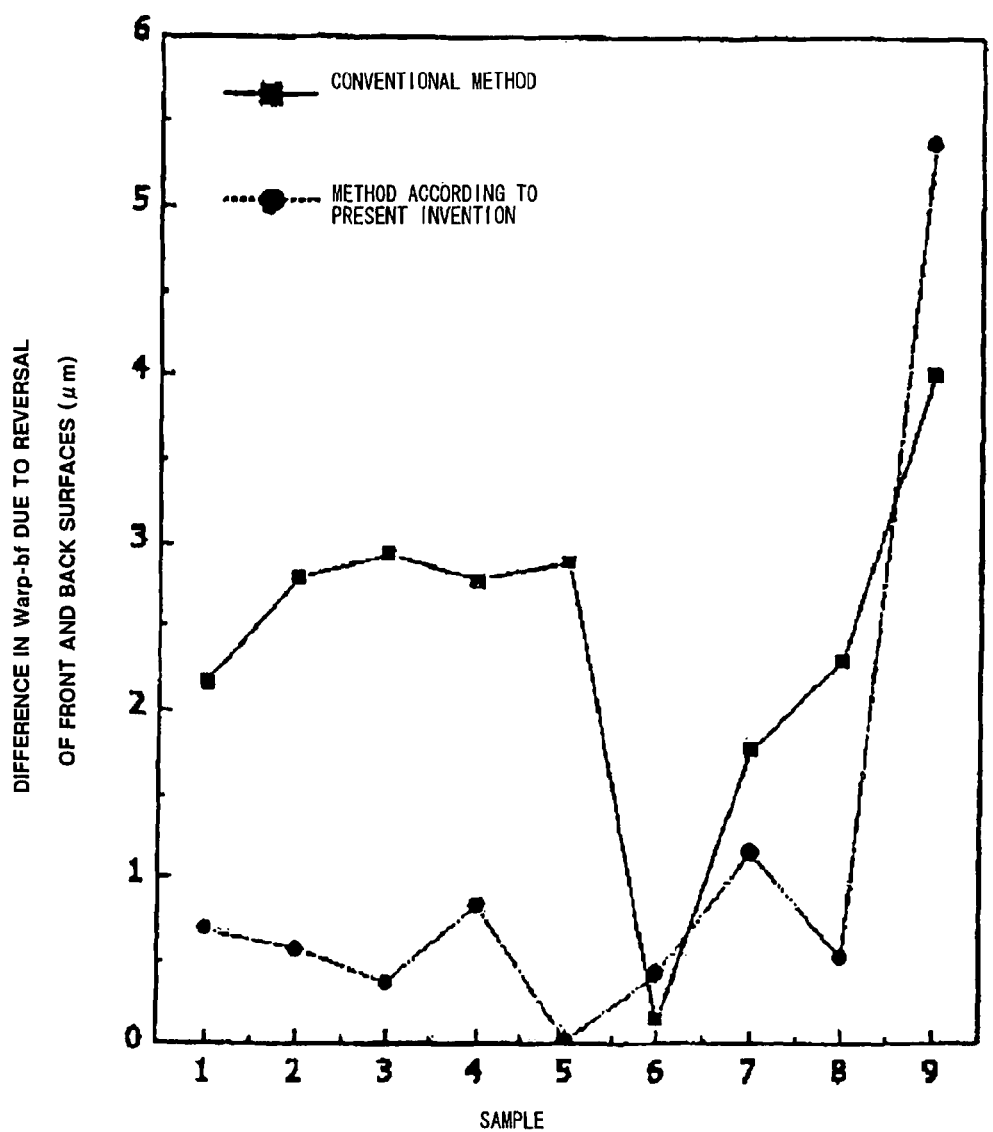
FIG. 10 is a comparative view of Example 2 and Comparative Example 2.

FIGS. 5 and 6 show measurement results of Comparative Example 1 and Example 1, and FIGS. 8 and 9 show measurement results of Comparative Example 2 and Example 2. Further, FIG. 7 shows comparison between Comparative Example 1 and Example 1, and FIG. 10 shows comparison between Comparative Example 2 and Example 2.

It can be understood from FIGS. 5 and 6 that measurement values of Bow-3p differ in both cases where the grippers according to the present invention are used and where the conventional grippers are used when the front and back surfaces are reversed to perform measurement.

Furthermore, FIG. 7 is a graph showing differences in the measurement values when the front and back surfaces are reversed in accordance with each of the case where the grippers according to the present invention are used and the case where the conventional grippers are used, and it can be understood that a difference in the measurement value when the front and back surfaces are reversed in the case where the grippers according to the present invention are used is generally slightly smaller.

As explained above, using the gripper according to the present invention enables stably holding the wafer, and even if the front and back surfaces are reversed to hold the wafer, a difference due to an influence of the reversal can be suppressed. Therefore, the reproducibility of a measurement value is higher than that in the conventional technology, thus improving the correlativity between apparatuses.

Moreover, it can be revealed from FIGS. 8 and 9 that measurement values of Warp-bf differ in both cases where the grippers according to the present invention are used and where the conventional grippers are used. However, it can be confirmed from FIG. 10 that this difference is generally smaller when the grippers according to the present invention are used.

Using the gripper according to the present invention can suppress a difference due to an influence of reversal of the front and back surfaces in this manner even if the front and back surfaces are reversed, and the reproducibility of a measurement value becomes higher than that in the conventional technology, thus enhancing the correlativity between apparatuses.

EXAMPLES 3 AND 4/COMPARATIVE EXAMPLES 3 AND 4

Then, each of the nine sample wafers is held by the grippers according to the present invention, measurement is repeated 10 times with respect to each sample wafer to obtain Bow-3p, and a difference between a maximum value and a minimum value of data from the measurement repeated for 10 times is obtained (Example 3).

Additionally, the conventional grippers were used to carry out the same measurement as that in Example 3 (Comparative Example 3).

Further, with respect to a Warp-bf value, the grippers according to the present invention and the conventional grippers were used to likewise carry out the measurement (Example 4, Comparative Example 4).

Figure 11:
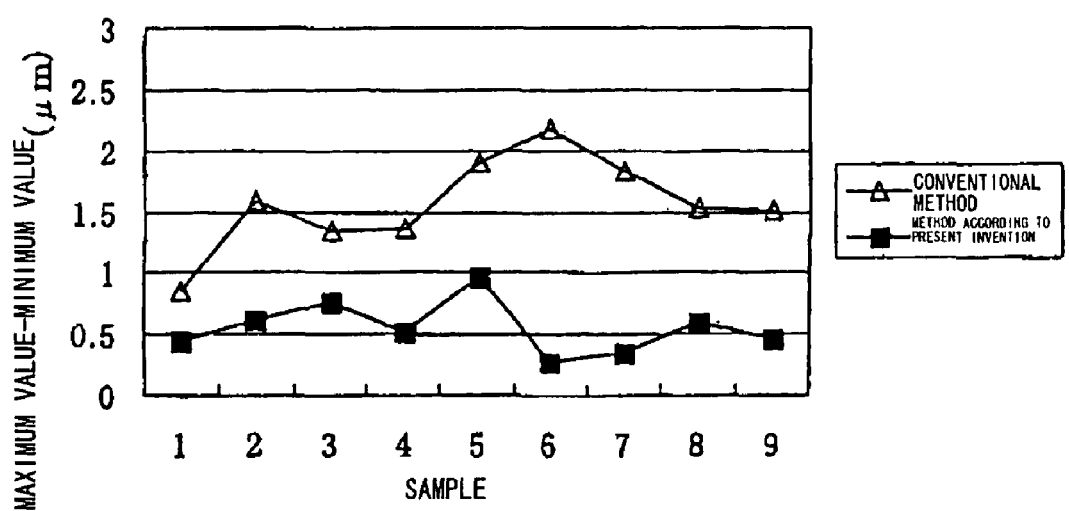
FIG. 11 shows Bow-3p (maximum value-minimum value) results in Example 3 and Comparative Example 3.
Figure 12:
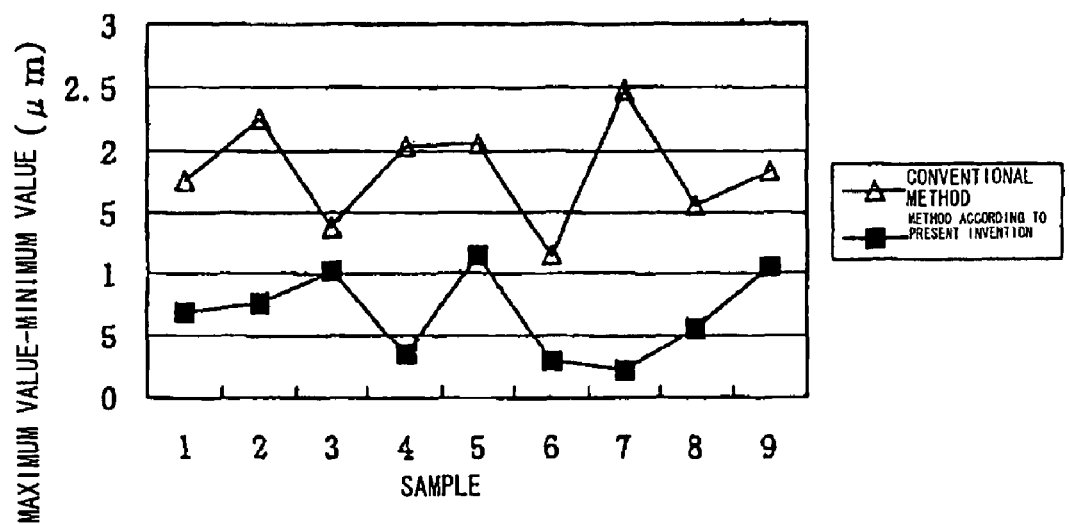
FIG. 12 shows Warp-bf (maximum value-minimum value) results of Example 4 and Comparative Example 4.

FIGS. 11 and 12 show measurement results of Examples 3 and 4 and Comparative Examples 3 and 4.

It can be understood from FIG. 11 that, as to a difference between the maximum value and the minimum value of Bow-3p, data of each sample wafer shows a small value in the case where the grippers according to the present invention are used as compared with the case where the conventional grippers are used.

As a result, this means that difference between the maximum value and the minimum value is considerably smaller in the case of the gripper according to the present invention, namely, a fluctuation in the Bow-3p is hence small in measurement of each sample wafer, and it can be revealed that the reproducibility of a measurement value is higher than that in the conventional technology.

Furthermore, FIG. 12 shows that a difference between a maximum value and a minimum value of Warp-bf has a smaller value in the case where the grippers according to the present invention are used as compared with the case where the conventional grippers are used. That is, like the above, this means that a fluctuation in the Warp-bf value is small. Based on this, since the gripper according to the present invention can further stably press the wafer, the reproducibility can be further improved.

EXAMPLES 5 AND 6/COMPARATIVE EXAMPLES 5 AND 6

Next, a position of a notch of a sample wafer was shifted, and the grippers according the present invention were used to measure Bow-3p. The position of the notch was rotated every 45° from 0° to 315°, and the sample wafer was held to perform measurement, a difference between a maximum value and a minimum value in values obtained from measurement carried out for eight times was obtained, and this measurement was performed with respect to each of nine sample wafers (Example 5).

Further, the conventional grippers were used to conduct the same measurement as that in Example 5 (Comparative Example 5).

Furthermore, in regard to a Warp-bf value of each sample wafer, both the grippers according to the present invention and the conventional technology were used to likewise carry out measurement (Example 6, Comparative Example 6).

Figure 13:
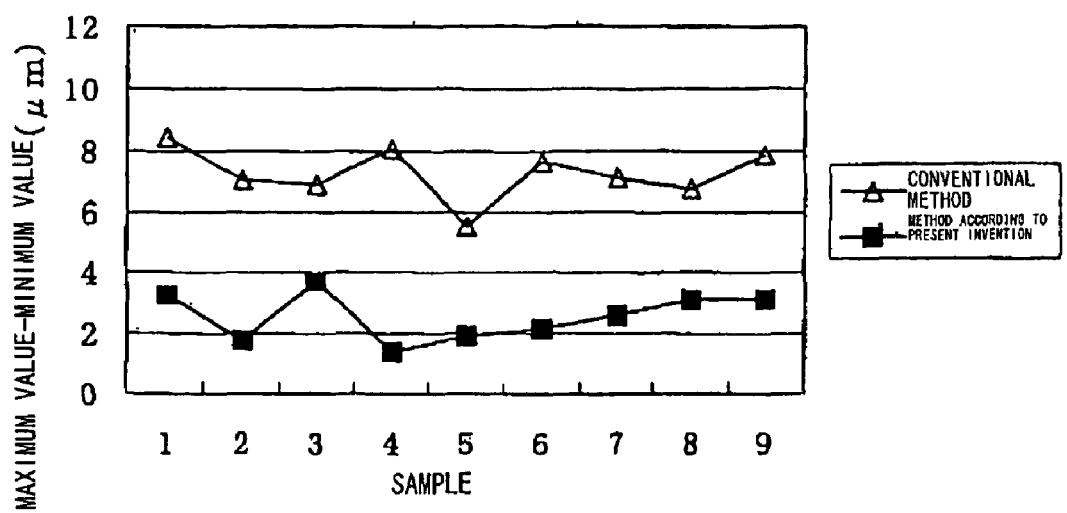
FIG. 13 shows Bow-3p (maximum value-minimum value) results of Example 5 and Comparative Example 5.
Figure 14:
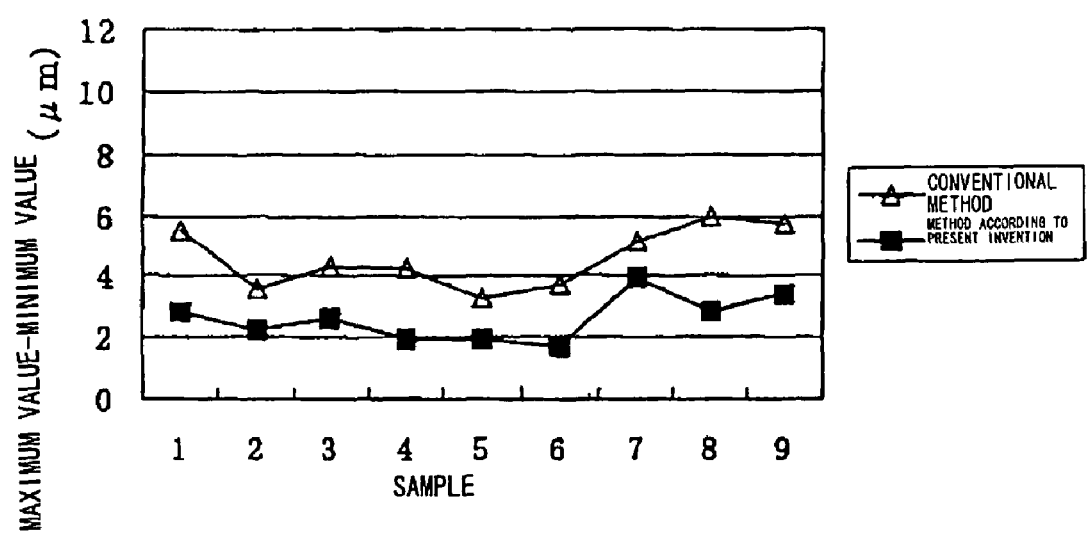
FIG. 14 shows Warp-bf (maximum value-minimum value) results of Example 6 and Comparative Example 6.

FIGS. 13 and 14 show measurement results of Examples 5 and 6 and Comparative Examples 5 and 6.

It can be understood from FIG. 13 that a difference between a maximum value and a minimum value of Bow-3p has a smaller value when the grippers according to the present invention are used as compared with the case where the grippers according to the conventional technology are used.

When the gripper according to the present invention and the gripper according to the conventional technology were used and the notch was rotated and held every 45° to perform measurement, it can be understood that using the gripper according to the present invention can further suppress a fluctuation in a Bow-3p value with respect to each holding position of the wafer. When the gripper according to the present invention is used in this manner, stability of a measurement value can be improved, and this suggests that a difference between apparatuses can be reduced.

It can be understood from FIG. 14 that a difference between a maximum value and a minimum value of Warp-bf has a smaller value when the grippers according to the present invention are used.

Like the above, a fluctuation in a value of Warp-bf is smaller. Based on this, it can be revealed that the gripper according to the present invention has a high degree of stability and can improve the reproducibility.

Based on Examples and Comparative Examples, when the holding gripper according to the present invention is used to hold the wafer, the wafer can be stably held as compared with the conventional gripper. Therefore, a fluctuation in a measurement value of Bow or Warp can be reduced, thereby improving the reproducibility or the correlativity between apparatuses.

It is to be noted that the present invention is not restricted to the foregoing embodiment. The foregoing embodiment is just an example, and any example which has a structure substantially the same as the technical concept explained in claims of the present invention and provides the similar actions and advantages is included in the technical scope of the present invention.

The invention claimed is:

1. A strip-like holding gripper which holds a semiconductor wafer when measuring a shape of the semiconductor wafer, comprising:
   a side where the semiconductor wafer is held, the side having a round shape; and
   a groove which holds an edge of the semiconductor wafer along a side surface of the round shape portion, the groove being provided on the side surface;

wherein:
  the groove comes into contact with the edge of the semiconductor wafer from a periphery of the wafer to hold the semiconductor wafer, and
  a cross-sectional shape of the groove has a curvature radius larger than a curvature radius of a shape in the edge of the semiconductor wafer, thereby the groove comes into contact with the semiconductor wafer at one point.

2. The holding gripper according to claim 1, wherein the round shape has a length of the holding gripper as a radius.

3. The holding gripper according to claim 2, wherein a material of at least a part of the holding gripper, which forms the groove that comes into contact with the edge of the wafer, is a synthetic resin.

4. A semiconductor wafer shape measuring apparatus, which holds a semiconductor wafer to measure a shape, comprising at least the holding gripper according to claim 3.

5. A semiconductor wafer holding method of holding a semiconductor wafer when measuring a shape of the semiconductor wafer, wherein a plurality of the holding grippers according to claim 3 are arranged at a periphery of the semiconductor wafer at intervals of 120°, and grooves of the respective holding grippers come into contact with the semiconductor wafer at intervals of 120° to hold the semiconductor wafer.

6. A semiconductor wafer shape measuring apparatus, which holds a semiconductor wafer to measure a shape, comprising at least the holding gripper according to claim 2.

7. A semiconductor wafer holding method of holding a semiconductor wafer when measuring a shape of the semiconductor wafer, wherein a plurality of the holding grippers according to claim 2 are arranged at a periphery of the semiconductor wafer at intervals of 120°, and grooves of the respective holding grippers come into contact with the semiconductor wafer at intervals of 120° to hold the semiconductor wafer.

8. The holding gripper according to claim 1, wherein a material of at least a part of the holding gripper, which forms the groove that comes into contact with the edge of the wafer, is a synthetic resin.

9. A semiconductor wafer shape measuring apparatus, which holds a semiconductor wafer to measure a shape, comprising at least the holding gripper according to claim 8.

10. A semiconductor wafer holding method of holding a semiconductor wafer when measuring a shape of the semiconductor wafer, wherein a plurality of the holding grippers according to claim 8 are arranged at a periphery of the semiconductor wafer at intervals of 120°, and grooves of the respective holding grippers come into contact with the semiconductor wafer at intervals of 120° to hold the semiconductor wafer.

11. A semiconductor wafer shape measuring apparatus, which holds a semiconductor wafer to measure a shape, comprising at least the holding gripper according to claim 1.

12. A semiconductor wafer holding method of holding a semiconductor wafer when measuring a shape of the semiconductor wafer, wherein a plurality of the holding grippers according to claim 1 are arranged at a periphery of the semiconductor wafer at intervals of 120°, and grooves of the respective holding grippers come into contact with the semiconductor wafer at intervals of 120° to hold the semiconductor wafer.

* * * * *